United States Patent [19]
Schenkel

[11] Patent Number: 6,034,517
[45] Date of Patent: Mar. 7, 2000

[54] HIGH EFFICIENCY STEP-DOWN SWITCHING REGULATORS

[75] Inventor: Jeffrey Schenkel, Burlington, Mass.

[73] Assignee: Linear Technology Corporation, Milpitas, Calif.

[21] Appl. No.: 09/179,534

[22] Filed: Oct. 27, 1998

[51] Int. Cl.[7] .................................. G05F 1/40; H02J 1/00
[52] U.S. Cl. ........................... 323/283; 323/285; 363/15; 363/79
[58] Field of Search ..................................... 323/282, 283, 323/284, 285; 363/15, 21, 79, 131

[56] References Cited

U.S. PATENT DOCUMENTS

| | | | |
|---|---|---|---|
| 4,975,820 | 12/1990 | Szepesi | 323/282 |
| 5,170,333 | 12/1992 | Niwayama | 323/285 |
| 5,668,493 | 9/1997 | Nelson et al. | 327/309 |
| 5,672,988 | 9/1997 | Nelson et al. | 327/108 |
| 5,731,694 | 3/1998 | Wilcox et al. | 323/287 |
| 5,731,731 | 3/1998 | Wilcox et al. | 327/403 |
| 5,747,976 | 5/1998 | Wong et al. | 323/282 |
| 5,770,940 | 6/1998 | Goder | 323/283 |

OTHER PUBLICATIONS

Linear Technology, *Wide Input Range, High Efficiency, Step–Down Switching Regulator*, LT1676 Prerelease (Apr. 1998).

Linear Technology, *Application Note 19*, LT1070 Design Manual (Jun. 1986).

*Primary Examiner*—Peter S. Wong
*Assistant Examiner*—Bao Q. Vu
*Attorney, Agent, or Firm*—Fish & Neave; Robert W. Morris; Garry J. Tuma

[57] ABSTRACT

The present invention relates to circuits and methods for improving the efficiency of step down switching regulators converting a high input voltage to a low output voltage. Furthermore, the present invention relates to circuits and methods to achieve such efficiency improvements while maintaining controllability during light output load conditions. In a preferred embodiment, the current mode switching regulator circuit includes a logic section, an output switch section controlled by the logic section, an oscillator for providing periodic timing signals to the logic section to turn the output switch ON, a feedback amplifier for developing an integrated error signal based on the output voltage, and a current comparator including an output, the current comparator for comparing the integrated error signal to the instantaneous value of the current in the output switch, the output of the comparator producing a signal which causes the logic section to turn the output switch OFF. Additionally, the output switch section is capable of delivering relatively faster voltage transitions under higher load conditions to minimize AC switching losses, and delivering relatively slower voltage transitions under lower load conditions to maintain controllability. A comparator circuit monitors load conditions via the current mode setpoint to determine proper output switch section operating mode.

29 Claims, 7 Drawing Sheets

HIGH EFFICIENCY STEP-DOWN SWITCHING REGULATORS

BACKGROUND OF THE INVENTION

The present invention relates to voltage regulator circuits. More particularly, the present invention relates to circuits and methods for improving the efficiency of step down switching regulators converting a high input voltage to a low output voltage. Furthermore, the present invention relates to circuits and methods to achieve such efficiency improvements while maintaining controllability during light output load conditions.

The purpose of a voltage regulator is to provide a substantially constant output voltage to a load from an input voltage source which may be poorly-specified or fluctuating. Generally there are two different types of regulators: linear regulators and switching regulators.

A linear regulator employs a pass element (e.g., a power transistor) coupled in series with a load and controls the voltage drop across the pass element to regulate the voltage which appears at the load. In contrast, a switching regulator employs a switch including a switching element (e.g., a power transistor) coupled in series or parallel with the load. The switching regulator controls the timing of the turning ON and turning OFF of the switching element (i.e., the duty cycle) to regulate the flow of power to the load. Typical switching regulators employ inductive energy storage elements to convert switched current pulses into a steady load current. Thus, power in a switching regulator is transmitted across the switch in discrete current pulses, whereas power in a linear regulator is transmitted across the pass element as a steady flow of current.

Switching regulators are generally more efficient than linear regulators (where efficiency is defined as the ratio of the power provided by the regulator to the power provided to the regulator). Because of this, switching regulators are often employed in portable battery-powered systems such as cellular telephones, cordless telephones, pagers, personal communicators, laptop computers, and wireless modems. The high efficiency offered by switching regulators offers extended battery life in such applications. A second advantage is the reduction in waste heat generated. This waste heat corresponds to the difference between the power provided to the regulator and the power provided by the regulator.

One significant component of operating loss in switching regulators is the power dissipated by the switching element. This power loss can be expressed as the product of the voltage drop across the switching element multiplied by the current through it. Indeed, average switch power loss can be calculated by numerically integrating the instantaneous switch power loss over an entire switching cycle. By convention, this power loss is defined to include a DC (or more properly "pseudo-DC") component and an AC component. The so-called DC component is more straightforward and represents the net power lost while the switch is completely, or nearly completely in its "ON" state. By contrast, the AC component represents net power lost when the switching element is in transition between "ON" and "OFF" states. In systems operating at a low "ON" duty cycle, the AC switching loss can become quite appreciable, and even exceed the DC component.

For example, in step-down or "buck" switching regulators, the combination of high input voltage and low output voltage results in a low "ON" duty cycle. Maintaining acceptable efficiency in such applications requires correspondingly rapid dV/dt and dI/dt behavior in the switch in order to minimize the transitions between "ON" and "OFF" states, thereby controlling AC switching loss.

A conventional bipolar integrated circuit process technology is a logical choice to implement such a buck converter. The process is inexpensive and offers the high breakdown voltage required to support high input voltage operation. For such a converter, the obvious choice for the actual switching element is an NPN power transistor operating in an emitter follower mode, with its collector coupled to the input voltage supply and its emitter coupled to the output node through an inductor. Such a configuration typically will require a lateral PNP connected between the collector and base of the output NPN transistor. This PNP transistor is then driven to saturation to pull the base of the output NPN as high as possible to minimize DC loss. However, the relatively slow nature of the lateral PNP yields unacceptable AC switching losses. Better AC performance may be obtained by using a second, smaller NPN transistor coupled to the output NPN in a Darlington configuration, this to be driven by a lateral PNP transistor. However, this configuration results in higher DC losses.

Prior art has included the use of a bootstrap node, which is driven above the input supply voltage. This allows controlled saturation of the NPN output device, thus minimizing DC losses, but there are potential disadvantages to this approach. The extra node required by the circuit topology uses up a valuable integrated circuit package pin. Additional circuit components are required to support the bootstrap node, adding to cost and complexity. And, with regard to the high input voltage applications of interest, the extra voltage headroom required for the bootstrap node limits maximum allowed input voltage.

A further potential problem (with or without a bootstrap node) is light load controllability. A circuit topology capable of delivering the fast dV/dt and dI/dt behavior required to reduce AC switching losses to an acceptable level will likely exhibit pulse skipping behavior at light output load. This is because the relatively slow lateral PNPs involved effectively set a lower limit on allowable output switch "ON" time (i.e., a minimum duty cycle). When the power required by the output load falls below that delivered by these periodic minimum width pulses, the converter will be forced into some sort of pulse skipping behavior to further limit delivered output power and maintain output voltage regulation. Such pulse skipping behavior is generally considered undesirable, as the resulting subharmonic behavior can result in electrical and/or audible noise interference.

In view of the foregoing, it would be desirable to provide a circuit and method for providing high dV/dt and dI/dt behavior during switch transitions to minimize AC switching losses.

It would also be desirable to provide low forward voltage drop in the switch "ON" state to minimize DC switching losses, without the use of a bootstrap node.

It would also be desirable to provide a method of avoiding pulse skipping behavior during lightly loaded conditions.

SUMMARY OF THE INVENTION

The foregoing and other objects of the invention are provided by a novel method and circuit for improving the efficiency of operation of a buck regulator called upon to convert a relatively high input voltage to a relatively low output voltage. Additionally, such method and circuit avoids the pulse skipping behavior at light output load traditionally exhibited under such input and output voltage conditions.

In a preferred embodiment, the current mode switching regulator circuit includes a logic section, an output switch section controlled by the logic section, an oscillator For providing periodic timing signals to the logic section to turn the output switch section ON, a feedback amplifier tar developing an integrated error signal based on the output voltage, and a current comparator including an output, the current comparator for comparing the integrated error signal to the instantaneous value of the current in the output switch section, the output of the comparator producing a signal which causes the logic section to turn the output switch section OFF. Additionally, the novel output switch section is capable of delivering relatively faster voltage transitions under higher load conditions to minimize AC switching losses, and delivering relatively slower voltage transitions under lower load conditions to maintain controllability. A comparator circuit monitors load conditions via the current mode setpoint to determine proper output switch section operating mode.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
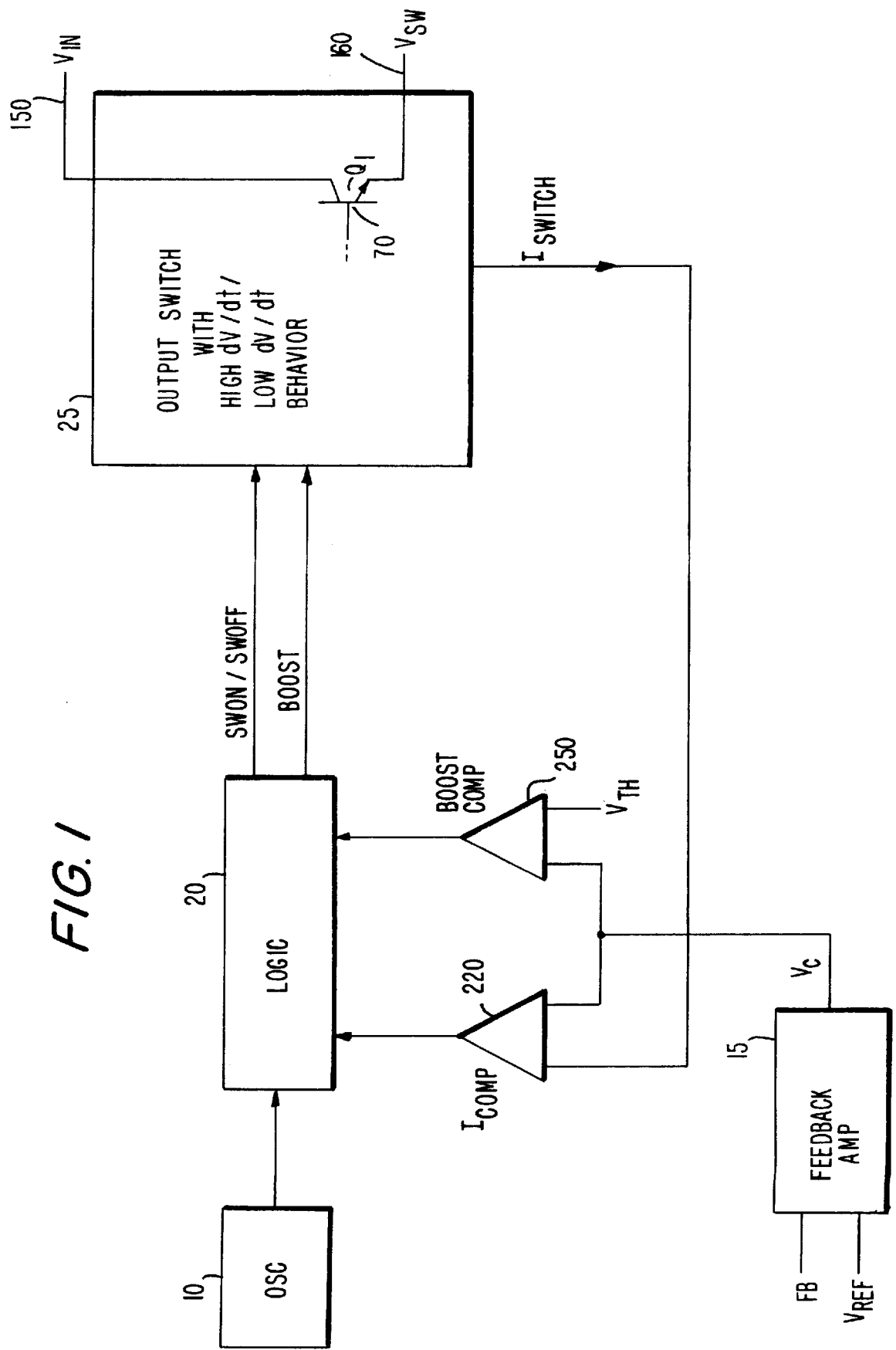
FIG. 1 is a circuit diagram of an exemplary embodiment of the present invention for improving the efficiency of a switching voltage regulator.

FIG. 1 is a simplified circuit diagram of a buck switching regulator incorporating circuitry operating in accordance with principles of the present invention. Features of such a regulator not necessary for understanding the present invention (e.g., oscillator and control circuitry, frequency compensation circuitry, current limit components, and output monitor/feedback circuitry) are not shown to avoid unnecessarily encumbering this disclosure.

FIG. 1 shows a switching regulator circuit having an input terminal 150 for connection to a source of input supply voltage and an output terminal 160 for supplying a regulated output voltage to a load. The switching regulator circuit preferably includes a current mode switching controller which preferably comprises a logic section 20, an output switch section 25 controlled by the logic section and an oscillator 10 for providing periodic timing signals to the logic section to turn the output switch section ON. The switching regulator circuit also preferably includes a feedback amplifier 15 for developing an integrated error signal base on the output voltage and a current comparator 220 for comparing the integrated error signal to the instantaneous value of the current in the output switch section. The output of the comparator produces a signal which causes the logic section to turn the output switch section OFF.

The output switch section is capable of selectively operating in a first mode (corresponding to FIG. 7a) with relatively faster voltage transitions for higher efficiency and a second mode (corresponding to FIG. 7b) with relatively slower voltage transitions for lighter loads. The switching regulator circuit preferably includes a boost comparator 250 with a first input coupled to receive the integrated error signal and a second input coupled to receive a fixed threshold voltage. The boost comparator selects the first mode or the second mode of the output switch section based on the level of the integrated error signal.

Figure 2:
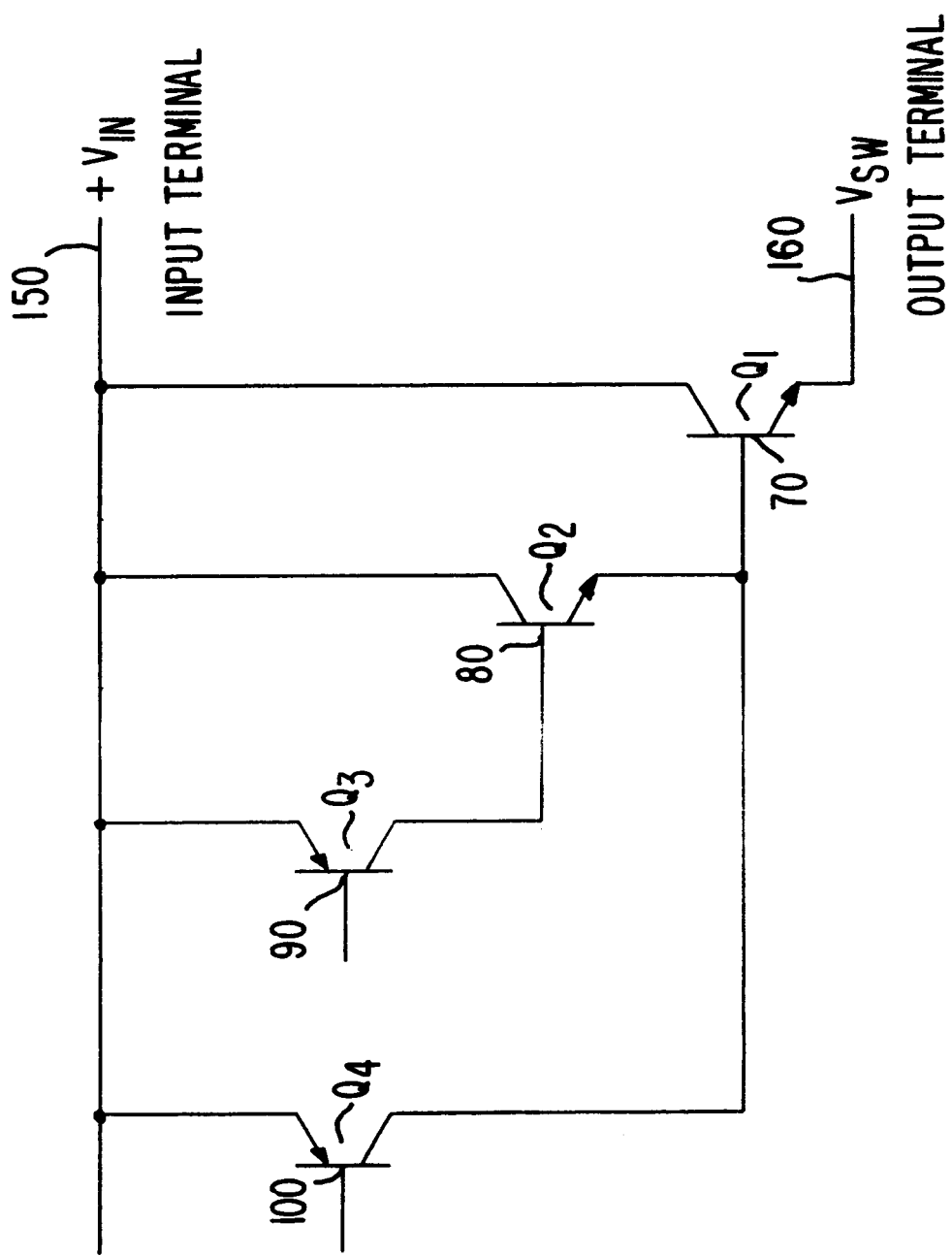
FIG. 2 is a circuit diagram of a exemplary embodiment of a portion of the circuit shown in FIG. 1.

A preferred implementation of the output switch section 25 of FIG. 1 is shown in FIG. 2. The output section preferably includes a first switching device 70 coupled between input terminal 150 and output terminal 160, a second switching device 80 for driving the first switching device, a third switching device 90 for driving the second switching device during the positive-going slewing portions of the output switch section output current waveform and a fourth switching device 100 for driving the first switching device after completion of slewing, thereby reducing voltage drop across the switching regulator circuit. The first arid second switching devices are configured in a Darlington arrangement. The first, second, third, and fourth switching devices preferably are transistors. The first and second switching devices are preferably NPN-type transistors and the third and fourth switching devices are preferably PNP-type transistors.

Figure 3:
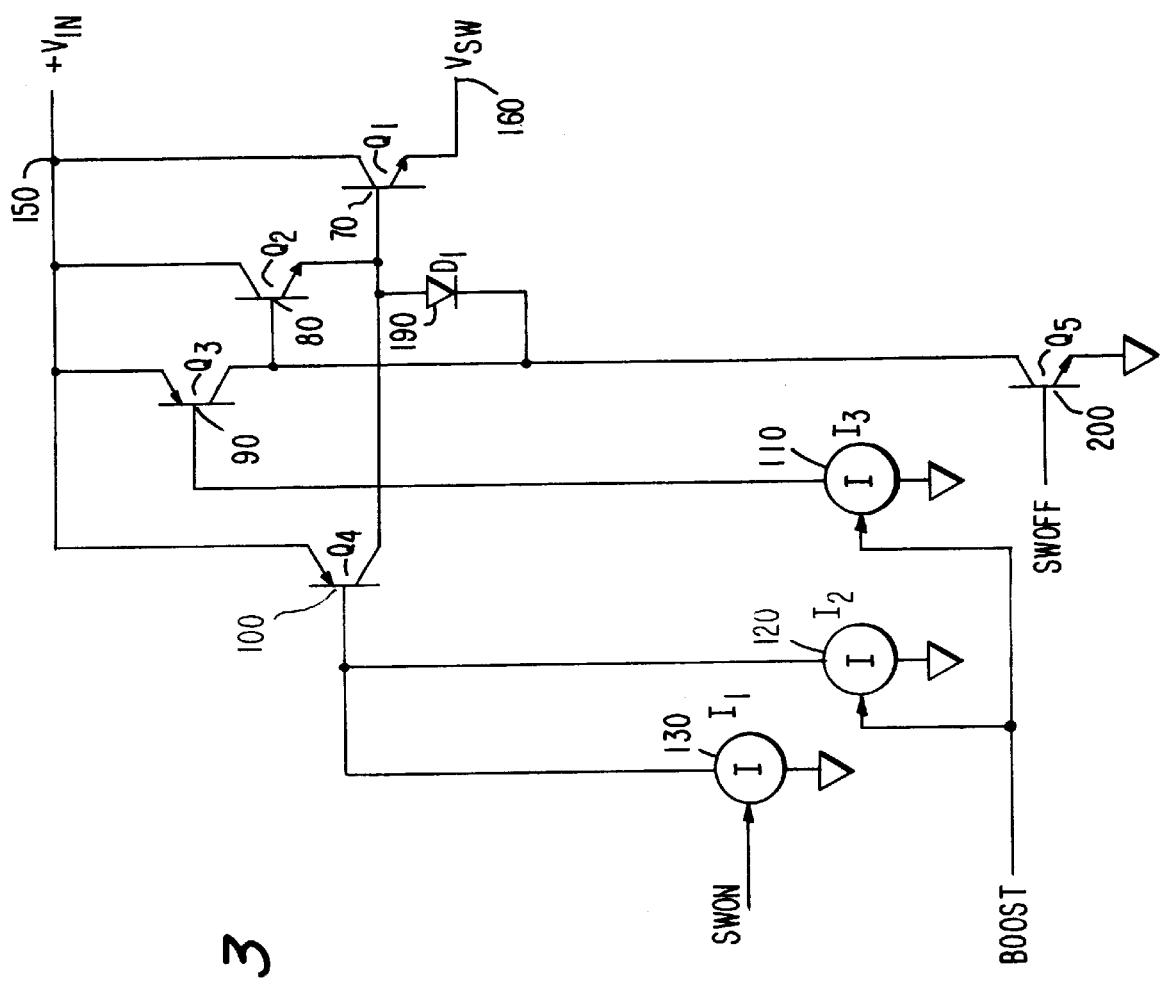
FIG. 3 is a circuit diagram of a exemplary embodiment of a portion of the circuit shown in FIG. 1.
Figure 7A:
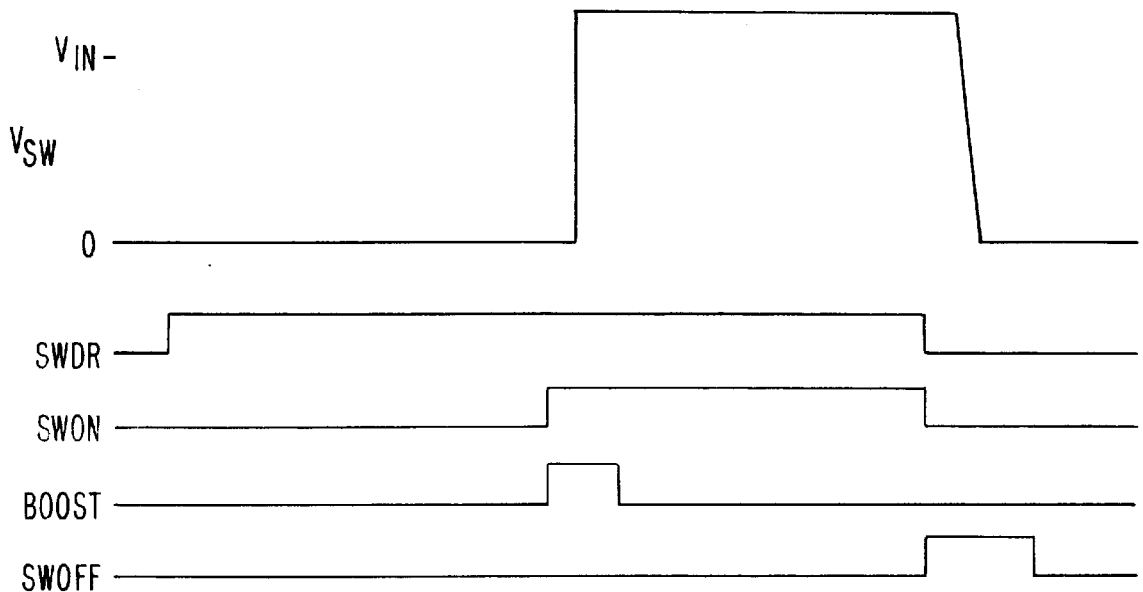
FIGS. 7a and 7b are timing diagrams illustrating operation of the circuits shown in FIGS. 1–6.
Figure 7B:
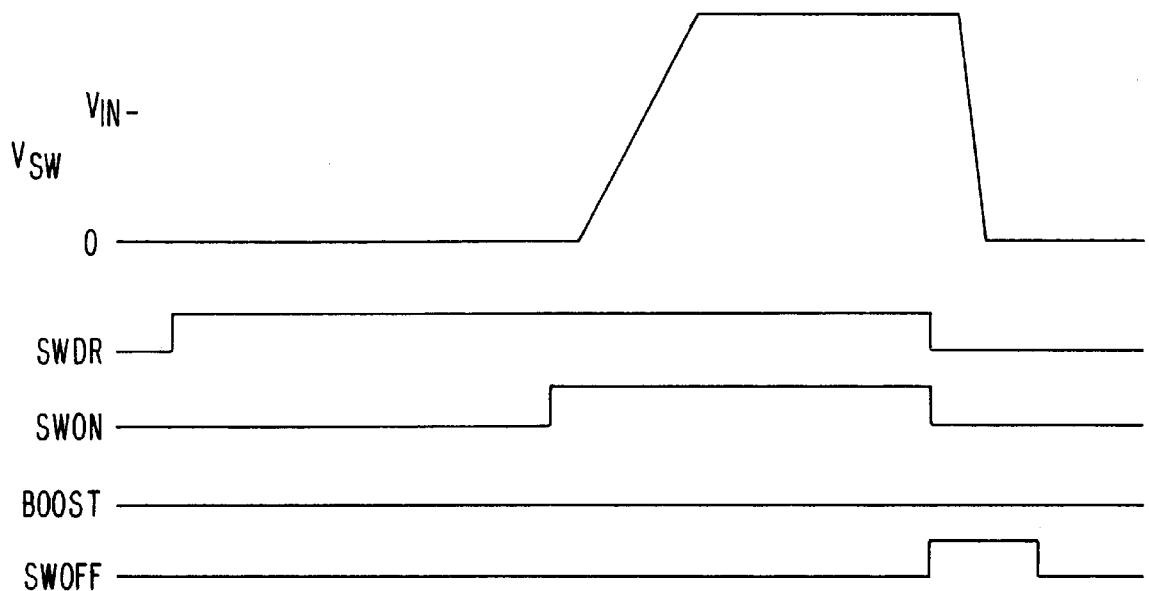

As shown in FIG. 3, a further preferred implementation of the output switch section 25 of the switching regulator circuit includes a first switchable current source 130 with an output coupled to the drive terminal of the fourth switching device 100, a second switchable current source 120 with an output coupled to the drive terminal of the fourth switching device 100, and a third switchable current source 110 with an output coupled to the drive terminal of the third switching device 90. The first switchable current source 130 (driven by the SWON signal) provides drive terminal current to the fourth switching device 100 for substantially the ON-time of the switching regulator, as shown in FIGS. 7a and 7b. The second and third switchable current sources (driven by the BOOST signal) selectably provide relatively large injections of charge into the drive terminals of the third and fourth switching devices for relatively short durations, as shown in FIG. 7a, thereby facilitating rapid turn on of the devices.

A preferred implementation of the output switch section 25 of the switching regulator circuit also includes a fifth switching device 200 coupled between the drive terminal of the second switching device 80 and ground, and a diode 190 coupled between the drive terminal of the first switching device 70 and the drive terminal of the second switching device 80, as shown in FIG. 3. The fifth switching device 200 and the diode 70 cooperate to rapidly turn the second switching device 80 OFF and then to rapidly turn the first switching device 70 OFF when the fifth switching device 200 is activated.

Figure 4:
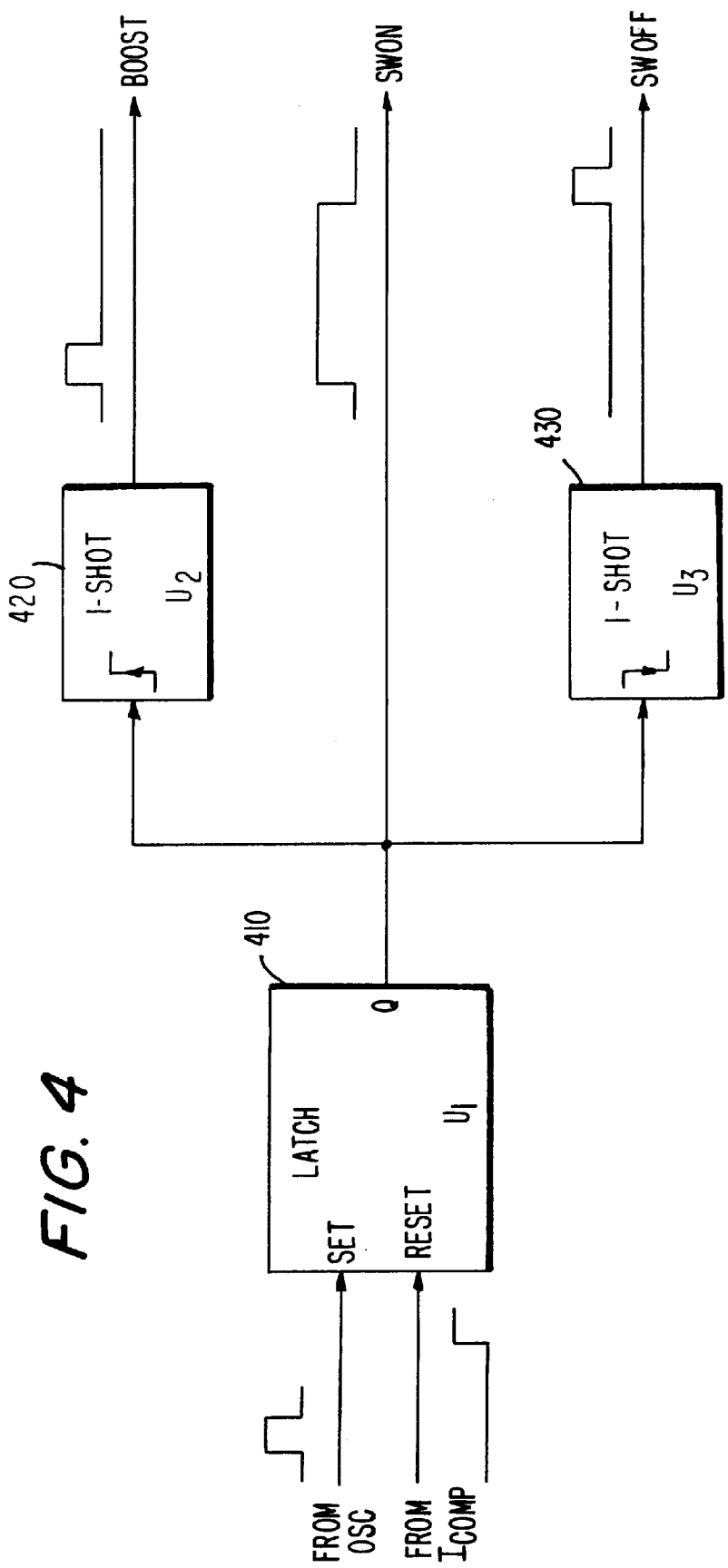
FIG. 4 is a circuit diagram of a exemplary embodiment of a portion of the circuit shown in FIG. 1.

As shown in FIG. 4, logic section 20 preferably comprises a latch 410 for supplying a switch ON signal, a first mono-stable multi-vibrator (i.e., a one shot) 420 for supplying a boost signal, and a second mono-stable multi-vibrator 430 for supplying a switch OFF signal. The latch includes a SET input coupled to receive a source of periodic pulses and a RESET input coupled to receive the output of a current comparator. The first mono-stable multi-vibrator includes an input coupled to receive the switch ON signal and is configured to produce the boost signal in response to the rising edge of the switch ON signal. The second mono-stable multi-vibrator includes an input coupled to receive the switch ON signal and is configured to produce the switch OFF signal in response to the falling edge of the switch ON signal.

Figure 5:
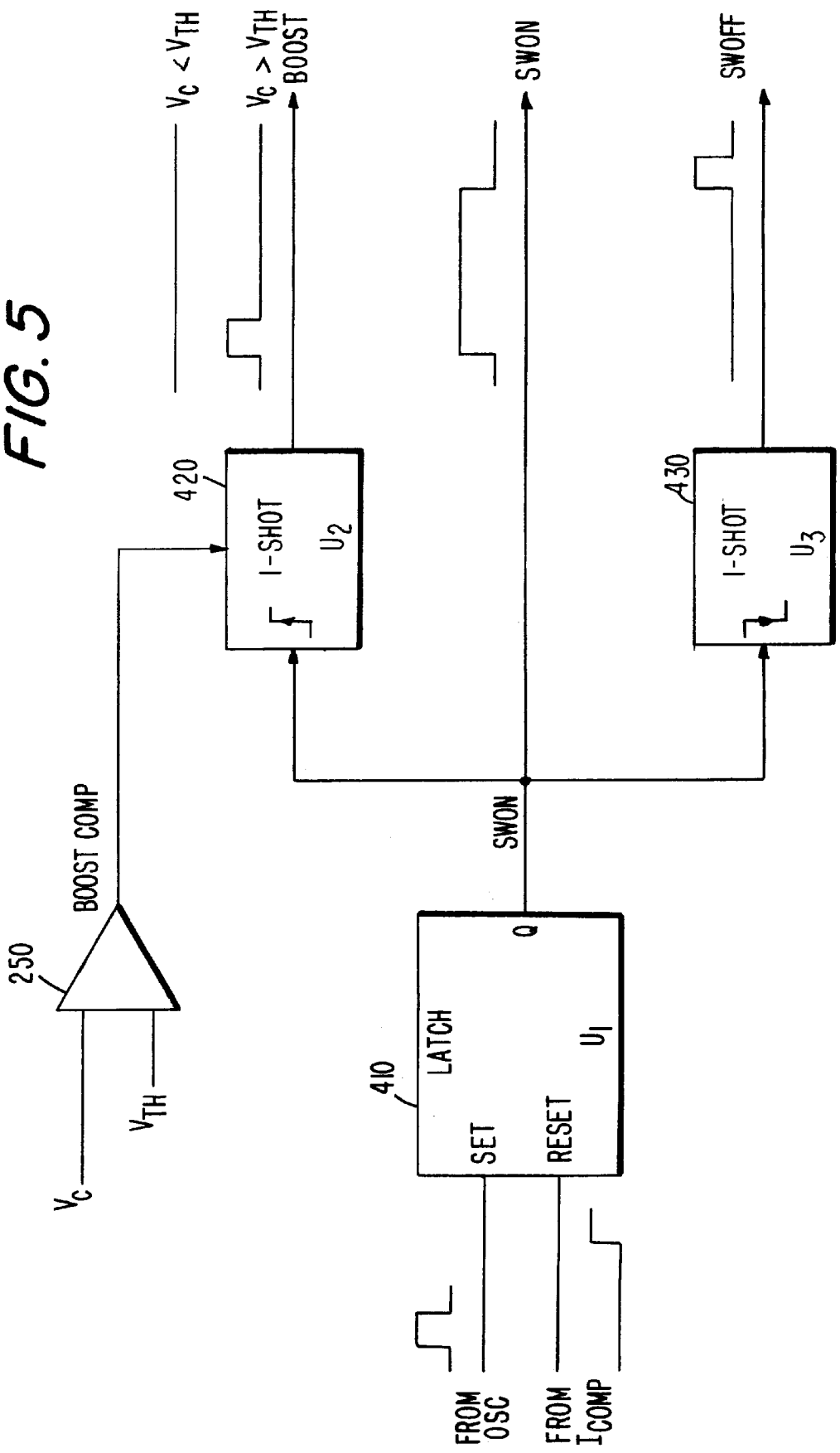
FIG. 5 is a circuit diagram of a exemplary embodiment of a portion of the circuit shown in FIG. 1.

As shown in FIGS. 1 and 5, the switching regulator circuit preferably includes a boost comparator 250 with a first input coupled to receive the integrated error signal and a second input coupled to receive a fixed voltage threshold. The boost comparator is configured to enable the first mono-stable multi-vibrator 420 (FIG. 4) when the integrated error signal exceeds the fixed voltage threshold.

Figure 6:
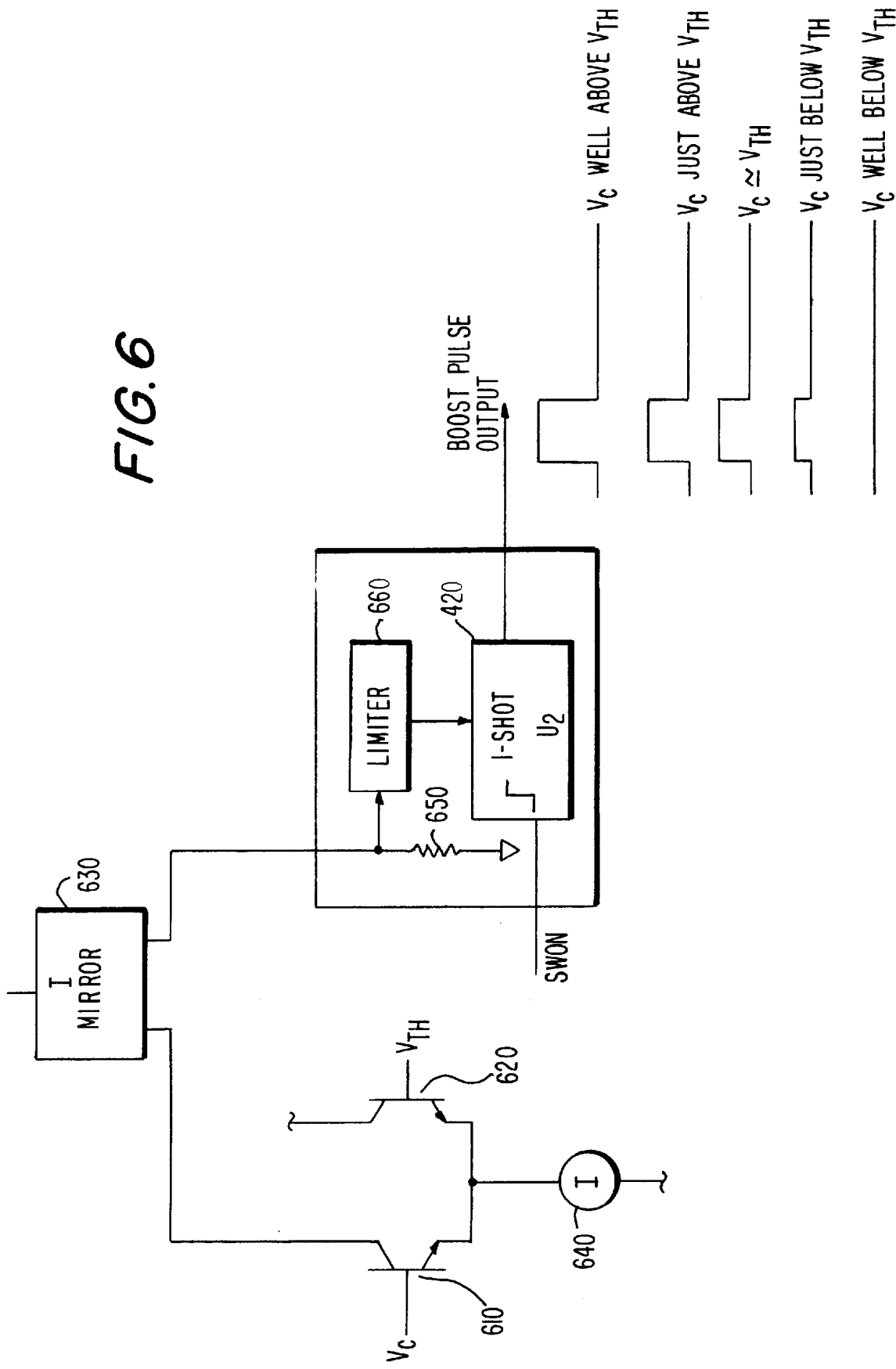
FIG. 6 Is a circuit diagram of a exemplary embodiment of a portion of the circuit shown in FIG. 1.

As shown in FIG. 6, the boost comparator preferably comprises a differential transistor pair (transistors 610, 620) coupled to receive the integrated error signal and the fixed voltage threshold. An intermediate output signal is derived from one or both collectors of the differential transistor pair (preferably using a circuit which includes a current mirror 630), a resistor 650, and a limiter 660). The intermediate output signal is used to control the first mono-stable multi-vibrator 420 to determine the amplitude of the boost signal.

Thus in accordance with the present invention, circuits and methods are provided that improve the efficiency of operation of a buck regulator called upon to convert a relatively high input voltage to a relatively low output voltage, additionally while avoiding the pulse skipping behavior at light output load traditionally exhibited under such input and output voltage conditions.

Persons skilled in the art will appreciate that the principles of the present invention can be practiced by other than the described embodiments, which are presented for purposes of illustration and not of limitation. The present invention is limited only by the claims which follow.

What is claimed is:

1. A switching regulator circuit having an input terminal for connection to a source of input supply voltage and an output terminal for supplying a regulated output voltage to a load, said switching regulator circuit comprising:

an output switch section that includes a first switching device coupled between said input terminal and said output terminal; and a logic section coupled to said output switch section, said logic section providing a first signal that turns ON said output switch section, a second signal that turns OFF said output switch section, and a third signal that activates one of at least two turn-on-speed modes of said output switch section, said logic section comprising a latch that receives signals indicating whether said output switch section should be turned ON or OFF;

wherein said output switch section selectively operates in at least one of a first turn-on-speed mode having relatively faster voltage transitions for higher efficiency and a second turn-on-speed mode having relatively slower voltage transitions for lighter loads.

2. The switching regulator circuit of claim 1 further comprising:

an oscillator for providing periodic timing signals to said logic section to turn said output switch section ON;

a feedback amplifier for developing an integrated error signal based on said output voltage; and a current comparator for comparing said integrated error signal to the instantaneous value of the current in said output switch section, said comparator providing a signal to said logic section to turn said output switch section OFF.

3. The switching regulator circuit of claim 1 wherein said output switch section further includes:

a second switching device for driving said first switching device, said first and second switching devices configured in a Darlington arrangement;

a third switching device for driving said second switching device during the positive-going slewing portions of the output switch section output current waveform; and a fourth switching device for driving said first switching device after completion of slewing to reduce voltage drop across said switching regulator circuit.

4. The switching regulator circuit of claim 3 wherein:

said first, second, third, and fourth switching devices comprise transistors.

5. The switching regulator circuit of claim 4 wherein:

said first and second switching devices comprise NPN-type transistors and said third and fourth switching devices comprise PNP-type transistors.

6. The switching regulator circuit of claim 3 further comprising:

a first switchable current source with an output coupled to the drive terminal of said fourth switching device.

7. The switching regulator circuit of claim 6 further comprising:

a second switchable current source with an output coupled to the drive terminal of said fourth switching device; and a third switchable current source with an output coupled to the drive terminal of said third switching device, wherein said second and third switchable current sources selectably provide relatively large injections of charge into the drive terminals of said third and fourth switching devices to facilitate rapid turn ON of said third and fourth switching devices.

8. The switching regulator circuit of claim 7 further comprising:

a fifth switching device couple between the drive terminal of said second switching device and ground; and a diode coupled between the drive terminal of said first switching device and the drive terminal of said second switching device, wherein said fifth switching device and said diode cooperate to rapidly turn said second switching device OFF and then to rapidly turn said first switching device OFF when said fifth switching device is activated.

9. The switching regulator circuit of claim 1 wherein said latch provides a switch ON signal, said latch including a SET input coupled to receive a source of periodic pulses and a RESET input coupled to receive the output of a current comparator; said logic section further comprising:

a first mono-stable multi-vibrator for supplying a boost signal, said first mono-stable multi-vibrator including an input coupled to receive said switch ON signal, said first mono-stable multi-vibrator configured to produce said boost signal in response to the rising edge of said switch ON signal; and a second mono-stable multi-vibrator for supplying a switch OFF signal, said second mono-stable multi-vibrator including an input coupled to receive said switch ON signal, said second mono-stable multi-vibrator configured to produce said switch OFF signal in response to the falling edge of said switch ON signal;

wherein:

said switch ON signal is said first signal;

said switch OFF signal is said second signal; and said boost signal is said third signal.

10. The switching regulator circuit of claim 9 wherein said output switch section further includes:

a second switching device for driving said first switching device, said first and second switching devices configured in a Darlington arrangement;

a third switching device for driving said second switching device during the positive-going slewing portions of the output switch section output current waveform; and a fourth switching device for driving said first switching device after completion of slewing to reduce voltage drop across said switching regulator circuit.

11. The switching regulator circuit of claim 10 further comprising:

a first switchable current source with an output coupled to the drive terminal of said fourth switching device, said first switchable current source coupled to receive said switch ON signal.

12. The switching regulator circuit of claim 11 further comprising:

a second switchable current source with an output coupled to the drive terminal of said fourth switching device; and a third switchable current source with an output coupled to the drive terminal of said third switching device, wherein said second and third switchable current sources selectably provide relatively large injections of charge into the drive terminals of said third and fourth switching devices to facilitate rapid turn ON of said third and fourth switching devices, and wherein said second and third switchable current sources are coupled to receive said boost signal.

13. The switching regulator circuit of claim 9 further comprising:

a boost comparator with a first input coupled to receive an integrated error signal and a second input coupled to receive a fixed voltage threshold, said boost comparator configured to enable said first mono-stable multi-vibrator when said integrated error signal exceeds said fixed voltage threshold.

14. The switching regulator circuit of claim 13 wherein said boost comparator comprises:

a differential transistor pair coupled to receive said integrated error signal at said first input and said fixed voltage threshold at said second input, wherein an intermediate output signal derived from one or both collectors of said differential transistor pair is used to control said first mono-stable multi-vibrator to determine the amplitude of said boost signal.

15. A method of operating a switching regulator circuit having an input terminal for connection to a source of input supply voltage and an output terminal for supplying a regulated output voltage to a load, said switching regulator circuit including a logic section and an output switch section, said method including:

producing a first signal that turns ON said output switch section;

producing a second signal that turns OFF said output switch section;

producing a third signal that activates one of at least two turn-on-speed modes of said output switch section;

operating in a first turn-on-speed mode having relatively faster voltage transitions for higher efficiency; and operating in a second turn-on-speed mode having relatively slower voltage transitions for lighter loads.

16. The method of claim 15 further comprising:

developing an integrated error signal based on said output voltage;

comparing said integrated error signal to the instantaneous value of the current in said output switch section; and selecting one of said first and second turn-on-speed modes based on the level of said integrated error signal compared to a threshold value.

17. A switching voltage regulator circuit having an input terminal for connection to a source of input supply voltage and an output terminal for supplying a regulated output voltage to a load, said regulator circuit comprising:

an output switch section having selectable high and low speed leading edge voltage transition modes;

a logic section coupled to said output switch section, said logic section providing a first signal that turns ON said output switch section, a second signal that turns OFF said output switch section, and a third signal that activates one of said modes;

an oscillator coupled to said logic section for providing periodic timing signals to said logic section to turn said output switch section ON;

a feedback amplifier for developing an error signal based on said output voltage;

a current comparator for comparing said error signal to the instantaneous value of the current in said output switch section, said current comparator providing a signal to said logic section indicating whether said output switch section should be turned OFF; and a boost comparator with a first input coupled to receive said error signal and a second input coupled to a source of fixed voltage, said boost comparator providing a signal to said logic section that selects one of said modes of said output switch section.

18. The switching voltage regulator circuit of claim 17 wherein said output switch section comprises:

a first switching means coupled between said input terminal and said output terminal;

a second switching means coupled between said input terminal and the drive terminal of said first switching means;

a third switching means coupled between said input terminal and the drive terminal of said second switching means; and a fourth switching means coupled between said input terminal and the drive terminal of said first switching means.

19. A method of operating a switching voltage regulator, said regulator including an output circuit including an output terminal for supplying current at a regulated voltage to a load, said output circuit including a plurality of switching elements, said method comprising:

monitoring at least one signal from said output circuit;

generating first and second control signals in response to said monitored signal;

activating a selected one of said plurality of switching elements in response to said first control signal; and injecting additional charge into said selected one of said plurality of switching elements in response to said second control signal to effect high speed output circuit slewing to maintain said output terminal at said regulated voltage at heavy loads.

20. The method of claim 19 wherein said generating said first and second control signals is in response to said current provided to said load.

21. The method of claim 20 further comprising:

activating a first sub-plurality of said plurality of switching elements for a first interval which is substantially all of the duration of the switching regulator circuit's switching period; and boosting a second sub-plurality of said plurality of switching elements for a second interval during heavy loading, said second interval beginning substantially simultaneously with said first interval but being substantially shorter in duration than said first interval.

22. The method of claim 21 further comprising:

activating a third sub-plurality of said plurality of switching elements for a third interval for turning OFF a fourth sub-plurality of said plurality of switching elements, said third interval occurring substantially simultaneously with the end of said first interval and substantially shorter in duration than said first interval.

23. A switching regulator circuit having an input terminal for connection to a source of input supply voltage and an output terminal for supplying a regulated output voltage to a load, said switching regulator circuit including a current mode switching controller which comprises:

an output switch section that selectively operates in at least first and second turn-on-speed modes;

a logic section that controls said output switch section, said logic section providing a first signal that turns ON said output switch section, a second signal that turns OFF said output switch section, and a third signal that activates one of said modes of said output switch section, said logic section comprising a latch that produces said first signal;

an oscillator for providing periodic timing signals to said latch to turn said output switch section ON;

a feedback amplifier for developing an integrated error signal based on said output voltage; and a current comparator including an output, said current comparator for comparing said integrated error signal to the instantaneous value of the current in said output switch section, the output of said comparator producing a signal which causes said logic section to turn said output switch section OFF;

wherein said output switch section includes:
 a first switching device coupled between said input terminal and said output terminal;
 a second switching device coupled between said input terminal and the drive terminal of said first switching device, said second switching device for driving said first switching device in a Darlington arrangement;
 a third switching device coupled between said input terminal and the drive terminal of said second switching device, said third switching device for driving said second switching device substantially during positive-going slewing portions of said output current waveform; and
 a fourth switching device coupled between said input terminal and the drive terminal of said first switching device, said fourth switching device for driving said first switching device substantially after completion of slewing to reduce voltage drop across said switching regulator circuit.

24. The switching regulator circuit of claim 23 further comprising:

a first switchable current source with an output coupled to the drive terminal of said fourth switching device;

a second switchable current source with an output coupled to the drive terminal of said fourth switching device; and a third switchable current source with an output coupled to said third switching device, wherein said first switchable current source provides drive terminal current to said fourth switching device for substantially the ON-time of the switching voltage regulator circuit, and wherein said second and third switchable current sources selectably provide relatively large injections of charge into the drive terminals of said third and fourth switching devices to facilitate rapid turn ON of said third and fourth switching devices.

25. The switching regulator circuit of claim 23 further comprising:

a boost comparator with a first input coupled to receive said integrated error signal and a second input coupled to receive a fixed threshold voltage, wherein said boost comparator selects one of said first and second modes of said output switch section based on the level of said integrated error signal.

26. The switching regulator circuit of claim 23 wherein:

said first, second, third, and fourth switching devices comprise transistors.

27. The switching regulator circuit of claim 26 wherein:

said first and second switching devices comprise NPN-type transistors and said third and fourth switching devices comprise PNP-type transistors.

28. The switching regulator circuit of claim 2 further comprising:

a boost comparator with a first input coupled to receive said integrated error signal and a second input coupled to receive a fixed threshold voltage, wherein said boost comparator selects one of said first and second modes of said output switch section based on the level of said integrated error signal.

29. The switching regulator circuit of claim 12 further comprising:

a fifth switching device coupled between the drive terminal of said second switching device and ground; and a diode coupled between the drive terminal of said first switching device and the drive terminal of said second switching device, wherein said fifth switching device and said diode cooperate to rapidly turn said second switching device OFF and then to rapidly turn said first switching device OFF when said fifth switching device is activated by said switch OFF signal.

* * * * *

UNITED STATES PATENT AND TRADEMARK OFFICE
CERTIFICATE OF CORRECTION

PATENT NO : 6,034,517

DATED : March 7, 2000

INVENTION : Jeffrey Schenkel

It is certified that error appears in the above-identified patent and that said Letters Patent are hereby corrected as shown below:

Column 3, line 1, "For" should be --for--;

line 3, "tar" should be --for--; and line 37, "Is" should be --is--.

Column 4, line 22, "arid" should be --and--.

Column 5, line 18, "630)," should be --630,--.

Signed and Sealed this

Twenty-fourth Day of April, 2001

Attest:

NICHOLAS P. GODICI

Attesting Officer

Acting Director of the United States Patent and Trademark Office